United States Patent [19]
Nagatomo

[11] Patent Number: 5,937,311
[45] Date of Patent: Aug. 10, 1999

[54] METHOD OF FORMING ISOLATION REGION

[75] Inventor: Yoshiki Nagatomo, Tokyo, Japan

[73] Assignee: OKI Electric Industry Co., Ltd., Tokyo, Japan

[21] Appl. No.: 08/747,026

[22] Filed: Nov. 7, 1996

[30] Foreign Application Priority Data

May 21, 1996 [JP] Japan ................................ 8-125985

[51] Int. Cl.$^6$ .................................................. H01L 21/76
[52] U.S. Cl. .................... 438/443; 438/444; 438/448; 438/439
[58] Field of Search .................................. 438/439, 443, 438/444, 448, 692; 148/DIG. 50

[56] References Cited

U.S. PATENT DOCUMENTS

| | | | |
|---|---|---|---|
| 5,298,451 | 3/1994 | Rao | 438/447 |
| 5,608,256 | 3/1997 | Rao | 257/510 |
| 5,652,177 | 7/1997 | Pan | 438/202 |

OTHER PUBLICATIONS

Mathews et al., Dry $O_2$ High Pressure Field Oxidation for 0.25um Isolation Technology; 1995 International Conference on Solid State Devices and Materials, 1995, pp. 899–901.

S. Deleonibus et al., A High Pressure High Temperature Poly Buffer LOCOS (HP–HTPBL) Isolation Process for 1Gbit Density Non Volatile Memories; ICSSDM, 1995 pp. 893–985.

S. Deleonibus et al., Three Dimensional Improvement of Field Oxidation by Using High Pressure Oxidation for the Gigabit Density Field Isolation, ICSSDM, 1993 pp. 525–527.

*Primary Examiner*—Trung Dang
*Attorney, Agent, or Firm*—Rabin & Champagne, P.C.

[57] ABSTRACT

A method of forming an isolation region exerts no adverse influence upon steps after forming the isolation region and is, besides, capable of forming the isolation region having a narrow isolation width. After a mask has been formed of an oxidationproof material such as $Si_3N_4$ on a silicon substrate, a field oxide is formed by effecting selective oxidation in a high-pressure dry oxygen atmosphere. Thereafter, a portion, protruded from the silicon substrate, of the formed field oxide is removed, thereby forming the isolation region.

5 Claims, 6 Drawing Sheets

METHOD OF FORMING ISOLATION REGION

BACKGROUND OF THE INVENTION

1. Field of the Invention

The present invention relates to a method of forming an isolation region that is used for manufacturing a semiconductor integrated circuit.

2. Description of the Related Art

In a semiconductor integrated circuit including a multiplicity of devices formed on a single piece of semiconductor material, namely, a semiconductor substrate, isolation regions are formed between device regions to electrically isolate the respective devices. There are a variety of known methods of forming the isolation regions. For instance, according to a method called a LOCOS (LOCal Oxidation of Silicon) method, the formation of the isolation region involves, at first, forming a pad oxide layer ($SiO_2$) and a silicon nitride layer ($Si_3N_4$) on a silicon substrate. Subsequently, an opening is formed in a portion, corresponding to the isolation region, of the silicon nitride layer by use of photo lithography and an etching technique. Thereafter, the silicon substrate is thermally treated in wet oxygen, and thick $SiO_2$ (field oxide) is formed in an area (the isolation region), corresponding to the opening of the silicon nitride layer, of the silicon substrate. That is, according to the LOCOS method, the isolation region is formed by the selective oxidation of the silicon substrate, wherein the silicon nitride layer is used as a mask.

According to this LOCOS method, the isolation regions can be relatively easily formed. Based on the LOCOS method, however, the oxidation progresses not only in a thicknesswise direction of the silicon substrate but also in a crosswise direction, and consequently there is formed a field oxide assuming such a configuration as to intrude beneath the silicon nitride layer in the vicinity of the opening. That is, according to the LOCOS method, the isolation region is formed with a larger width corresponding to an oxide (known as a bird's beak because of its configuration) formed by the crosswise oxidation, than the width of the isolation region defined by a treatment of the silicon nitride layer.

Therefore, only an isolation region having an isolation width larger than a given value can be formed by the LOCOS method alone, and, if an isolation region having a narrow isolation width is required to be formed, the isolation region is formed by using a so-called trench method in combination therewith. In this case, to begin with, a isolation region having a large isolation width among the isolation regions that should be formed is formed on the silicon substrate by employing the LOCOS method. Subsequently, a trench is formed in a portion of the silicon substrate, where an isolation region having a narrow isolation width, of the silicon substrate. Then, silicon oxides are deposited on the silicon substrate by a CVD (Chemical Vapor Deposition) method so that the relevant trench is filled with silicon oxides ($SiO_2$). Thereafter, the same silicon oxides are etched back, thereby forming a structure in which the silicon oxides are left within only the trench.

Thus, if the LOCOS method and the trench method are employed in combination, it is possible to form an isolation region having a narrow isolation width and an isolation region having the larger isolation width. However, the isolation regions based on the two methods must be formed sequentially, and hence a problem arises, wherein a greater amount of time than in the case of forming an isolation region by use of only one of the two methods, is needed.

Note that the trench method entails a difficulty of filling the interior of the trench having a larger width with the silicon oxides. Hence, forming the isolation region having the narrow isolation width and the isolation region having the larger isolation width by only the trench method is not practiced.

Desired therefore is a method capable of forming the isolation regions having a variety of isolation widths in a short period of time (by a small number of steps). A method called a high-pressure oxidation method is proposed as one candidate for such methods.

The high-pressure oxidation method is a method classified as a LOCOS method. According to the high-pressure oxidation method, after a mask has been composed of the silicon nitride layer, the silicon substrate in oxidized in dry $O_2$ at a pressure on the order of 25 atm. at a temperature of approximately 1000° C. According to this method, the oxidation progresses in a vertical direction faster than the oxidation in the crosswise direction, and therefore field oxide with a small bird's beak can be formed. Incidentally, for details of oxidation conditions based on the high-pressure oxidation method and a corresponding relationship between a characteristic and a configuration of the field oxide to be formed, reference is made to pp.525–527, Extended Abstracts of the 1993 International Conference on Solid State Devices and Materials, Makuhari, 1993, and pp.899–901, Extended Abstracts of the 1995 International Conference on Solid State Devices and Materials, Osaka, 1995.

As stated above, when using the high-pressure oxidation method, field oxide with the small bird's beak can be formed. Hence, it follows that the isolation region having the narrow isolation width can be formed together with the isolation region having the large isolation width. However, if the isolation region is formed simply by using the high-pressure oxidation method, a much steeper stepped portion than in the case of forming the isolation region by suing the LOCOS method and the trench method in combination, is formed at a boundary between the isolation region and the device region.

That is, when forming the isolation region by employing the LOCOS method and the trench method in combination, the field oxide (the isolation region) formed based on the LOCOS method comes to have a comparatively large bird's beak, and hence there is no possibility to form a portion of the field oxide with an abrupt fluctuation in height at the boundary between the device region and the isolation region. Further, when forming the isolation region having the narrow isolation width, the etch-back process is carried out, and therefore a portion with an abrupt fluctuation in height is never formed in the periphery of this isolation region.

Contrastingly, when forming the isolation region based on the high-pressure oxidation method, the field oxide is formed without a large bird's beak, and consequently a portion with a relatively abrupt fluctuation in height is produced at the boundary between the isolation region and the device region.

Thus, in the case of forming the isolation region by the high-pressure oxidation method, there must be formed a structure including a steep stepped portion on the surface thereof. As a result, some problems (a disconnection of wire, and formation of etching residue occur when performing a variety of treatments after forming the isolation region.

SUMMARY OF THE INVENTION

Accordingly, it is a first object of the present invention to provide a method of forming an isolation region, which is capable of manufacturing a semiconductor integrated circuit including an isolation region having a narrow isolation width and, besides, assuming a flat surface configuration.

It is a second object of the present invention to provide a method of forming an inter device isolation region, which is capable of forming a hyperfine isolation region without using a lithography technique exhibiting a high resolution.

To accomplish the first object given above, a first method by which an isolation region is formed according to the present invention, comprises a mask forming step, an oxide forming step and a polishing step. In the mask forming step a mask having an opening in an area is formed where the isolation region should be formed on a semiconductor substrate and is composed of oxidation-proof material. In the subsequent oxide forming step, the semiconductor substrate the mask in the mask thereon is thermally treated in an oxidative atmosphere of such a pressure that oxidation in a thicknesswise of the semiconductor substrate progresses faster than oxidation in a direction orthogonal to the thicknesswise direction. As a result, an oxide is formed on a portion of the semiconductor substrate corresponding to the opening of the mask. Then, in the polishing step, the semiconductor substrate is polished so that a portion of the oxide protruding from the semiconductor substrate is removed.

That is, according to the first isolation region forming method, the semiconductor substrate formed with the mask is subjected to an oxidation treatment under such a pressure (on the order of, e.g., 25 atm) that the oxidation in the thicknesswise direction of the Semiconductor substrate progresses faster than the oxidation in the direction orthogonal to the thicknesswise direction, thereby forming the field oxide with a small bird's beak. Then, the portion of the field protruding from the semiconductor substrate is polished, whereby the isolation is formed flush with other regions.

Note that the mask formed in the mask forming step is not necessarily composed of one kind of material but may be composed of, e.g., an oxide and a nitride.

Further, to accomplish the first object given above, a second method by which an isolation region is formed comprises a mask forming step, a substrate processing step and an oxide forming step. In the mask forming step, a mask having an opening in an area where the isolation region should be and composed of an oxidation-proof material, is formed on a semiconductor substrate. In the substrate processing step, the semiconductor substrate is processed so as to form a recess in an area corresponding to the opening of the mask. In the subsequent oxide forming step, the semiconductor substrate is thermally treated in an oxidative atmosphere of such a pressure that oxidation in a thicknesswise direction of the semiconductor substrate progresses faster than oxidation in a direction orthogonal to the thicknesswise direction. An oxide is formed on a portion of the substrate corresponding to the opening of the mask.

Namely, according to the second isolation region forming method, the recessed portion is formed in the semiconductor substrate, and a growth (the oxidation of the semiconductor substrate) of the oxide is started from the surface of the recessed portion. Further, a method of effecting the oxidation in order to reduce the bird's beak of the oxide (the field oxide) formed in the recessed portion of the substrate involves the use of a thermal treatment in an oxidative atmosphere of such a pressure (e.g., 25 atm.) that the oxidation in the thicknesswise direction progresses faster than the oxidation in the direction orthogonal to the thicknesswise direction.

Thus, according to the second isolation region forming method, the oxidation of the semiconductor substrate is started not from the original surface of the semiconductor substrate but from the surface of the recessed portion of the substrate. Therefore, when the oxide (the field oxide) is formed to a depth needed for the isolation according to this forming method, the size of the portion of the oxide protruding from the surface of the semiconductor substrate, is smaller by 2 d (d is the depth of the recessed portion) than in the case of providing no recessed portion. Namely, if this forming method is carried out by selecting the depth of the recessed portion corresponding to a size of the field oxide to be formed, it follows that an isolation region flush with other regions is formed.

Note that the polishing step may be further added, as a matter of course, added after the step of forming the oxide to obtain a structure having the flat surface.

Also, according to the second isolation region forming method, there may be adopted a mask forming step including a first layer forming step, a second layer forming step, an oxidizing step and a patterning step. In the first layer forming step, a first layer composed of an oxidation-proof material is formed on the semiconductor substrate. Formed in the second layer forming step on the first layer formed in the first layer forming step is a second layer including an opening in an area corresponding to the area where the isolation region should be formed and composed of such a material that a volume increases due to oxidation. In the oxidizing step, the second layer formed in the second layer forming step and including the opening, is oxidized. In the patterning step, the first layer is etched, with the second layer oxidized in the oxidizing step being used as an etching mask.

Thus, in the mask forming step, the second layer, formed in the second layer forming step and having the opening, is oxidized in the oxidizing step, with the result that the size of the opening is reduced. Then, the first layer, composed of the oxidation-proof material, is etched, wherein the oxide pattern having the opening the size of which is reduced, serves as the etching mask. The pattern used as a mask in the oxide forming step is thereby formed.

Thus, when using this mask forming step, a mask pattern (the first layer after etching) having a smaller opening than the mask pattern (the second layer having the opening) formed by use of the lithography technique, is formed by a treatment such as oxidation. Therefore, if this mask forming step is used for the present isolation region forming method, the second object is accomplished together with the above-described first object.

Furthermore, the second isolation region forming method may involve the use of a mask forming step including a first layer forming step, a second layer forming step, a third layer forming step and a removing step. In the first layer forming step, a first layer composed of an oxidation-proof material is formed on the semiconductor substrate. In the second layer forming step; a second layer including an opening larger than the area where the isolation region should be formed and composed of a material whose volume increases when oxidized, is formed on the first layer formed in the first layer forming step. In the third layer forming step, a third layer composed of an oxidation-proof material is formed on the second layer formed in the second layer forming step and including the opening. In the removing step, the third layer and the first layer that exist on a bottom surface of the opening are removed in such a form that the portions of third layer on side surfaces of the opening in the third layer, are left.

That is, in this mask forming step, the third layer is formed on the second layer formed in the second layer forming step and having the opening, whereby the size of the opening is reduced. Then, the third layer and the first layer that exist on the bottom surface of the opening are removed by anisotropic etching, etc. in such a form that the third layers formed on the side surfaces of the opening are left. In the oxide forming step, the pattern used as a mask is formed.

If a mask forming step consisting of such respective steps is employed, a mask pattern having a opening smaller than the mask pattern (the second layer having the opening) formed by use of the lithography technique, is formed by a treatment such as deposition of the oxidation-proof material layer (the third layer). Therefore, if this mask forming step is employed for the present isolation region forming method, the second object is accomplished together with the first object described above.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Embodiments of the present invention will be hereinafter specifically described.

First Embodiment

FIGS. 1A–1E illustrate an outline of a method of forming an isolation region in accordance with a first embodiment.

Figure 1A:
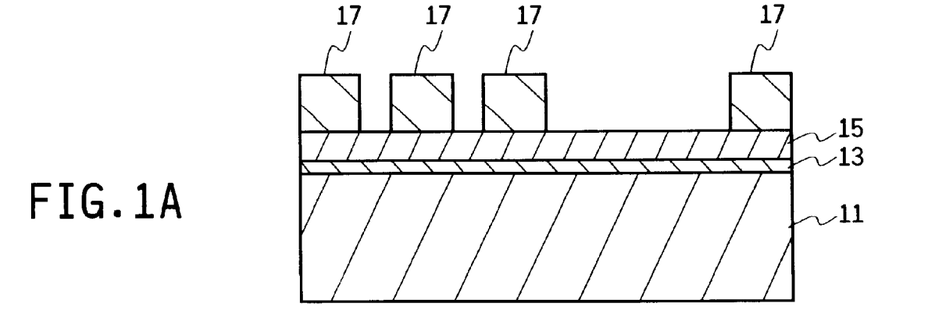
FIGS. 1A through 1E are sectional views of assistance in explaining a method of forming an isolation region in accordance with a first embodiment.

When forming the isolation region based on the present method, at first, a pad oxide layer 13 having a thickness of 5–30 nm is formed by thermal oxidation on a silicon substrate semiconductor substrate 11 in order to obtain a structure shown in FIG. 1A. Formed subsequently on the pad oxide layer 13 is a silicon nitride layer 15 having a thickness of 50–300 nm by a CVD (Chemical Vapor Deposition) method, etc. Thereafter, a photo resist is coated over the silicon nitride layer 15, and a resist pattern 17 formed with an opening (where no resist exists) is formed in an area where the isolation region is formed.

Next, with the resist pattern 17 serving as a mask, a part of the silicon nitride layer 15 is removed by etching. Thereafter, the resist pattern 17 is removed, and, as illustrated in FIG. 1B, a structure having a silicon nitride layer 15x undergoing the patterning, is formed on the pad oxide layer 13.

Figure 1B:
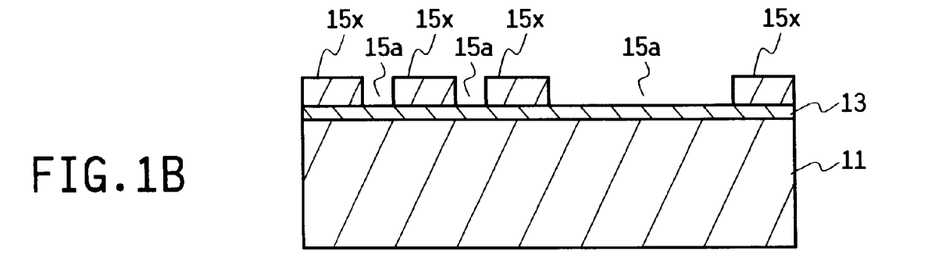
Figure 1C:
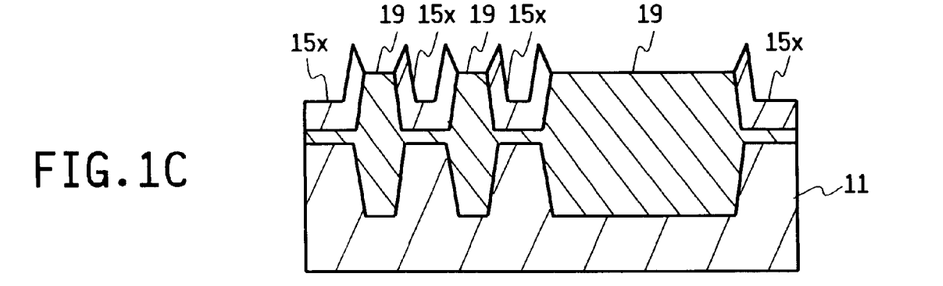

Subsequently, a structure shown in FIG. 1B is treated for several minutes through several tens minutes in dry $O_2$ at a pressure on the order of 25 atm. at and at a temperature in the range of 900–1000° C., and, as schematically shown in FIG. 1C, a field oxide 19 having a thickness of 200–600 nm is formed in an area where the silicon nitride layer 15x is not provided. Thereafter, the silicon nitride layer 15x is removed by thermal phosphoric acid, etc., thereby forming a structure shown in FIG. 1D.

Figure 1D:
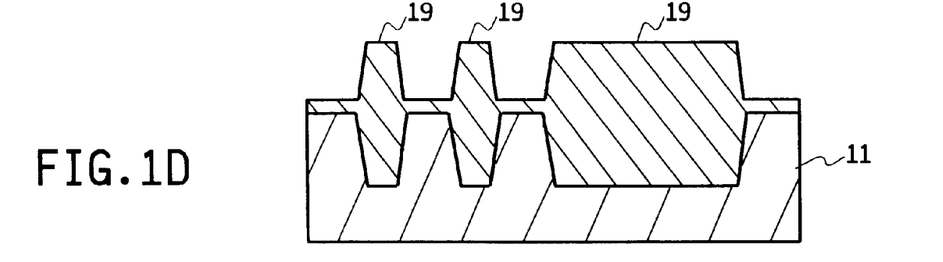

As already explained, in a oxidizing treatment in a high pressure oxygen atmosphere, the oxidation has difficulty progressing in a direction (hereinafter termed a crosswise direction) parallel to the substrate surface of the silicon substrate 11. Therefore, as schematically illustrated in FIG. 1C and 1D, it follows that the field oxide 19 with a small bird's beak is formed on the silicon substrate 11 (inside). Because of the bird's beak is small, however, a portion of the field oxide 19, protruding from the surface of the silicon substrate 11, has steep inclinations.

Figure 1E:
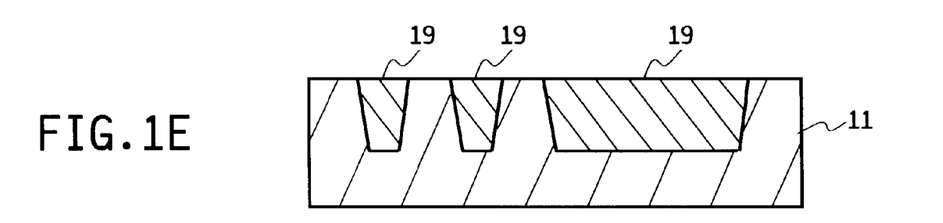

According to the present forming method, with respect to the structure including such a protruding portion, the protruding portion is removed (polished) by a CMP (Chemical Mechanical Polishing) method, whereby a structure having a flat surface configuration is formed as shown in FIG. 1E.

Thus, the isolation region formed by the present forming method is flush with other portions. Hence, according to the present method, it is feasible to form the structure enough to easily execute a wiring process afterward.

Second Embodiment

A method of forming the isolation region in accordance with a second embodiment will be hereinafter discussed with reference to FIGS. 2A–2E.

Figure 2A:
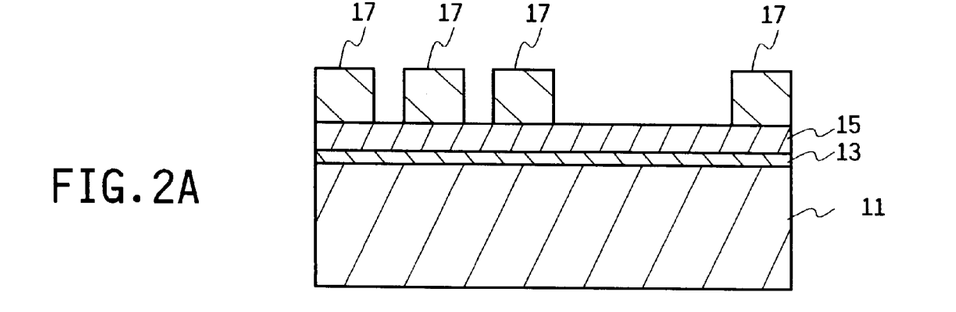
FIGS. 2A through 2E are sectional views of assistance in explaining the isolation region forming method in a second embodiment.

When forming the isolation region by the present method, to start with, a structure illustrated in FIG. 2A is formed by the same procedures as those used in the first embodiment. Subsequently, the silicon nitride layer 15x with the same pattern as the resist pattern 17 is formed on the pad oxide layer 13 by effecting photolithography and etching. Then, the resist pattern 17 used as the mask is removed.

Figure 2B:
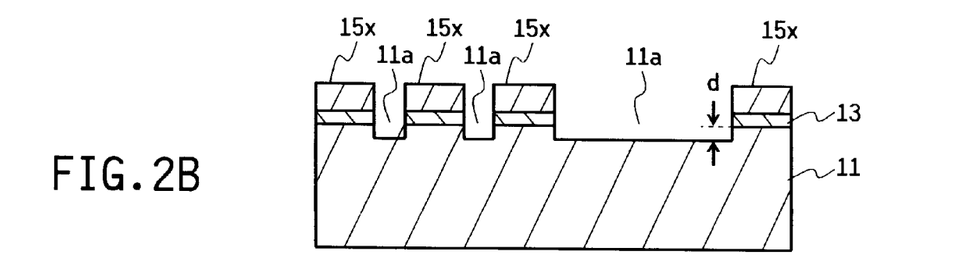
Figure 2C:
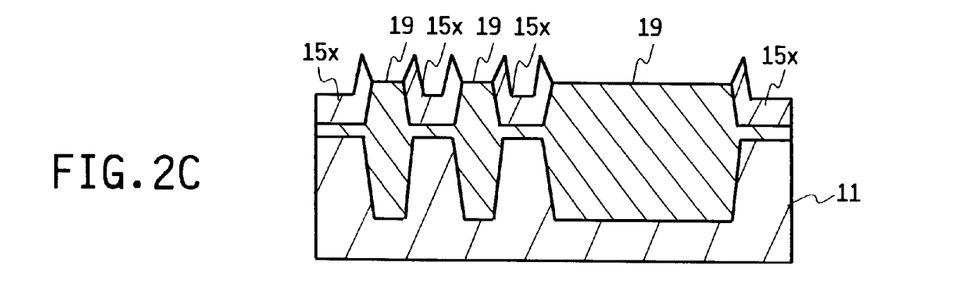
Figure 2D:
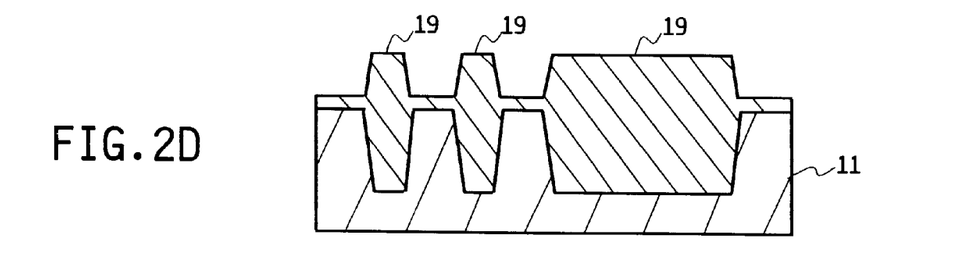
Figure 2E:
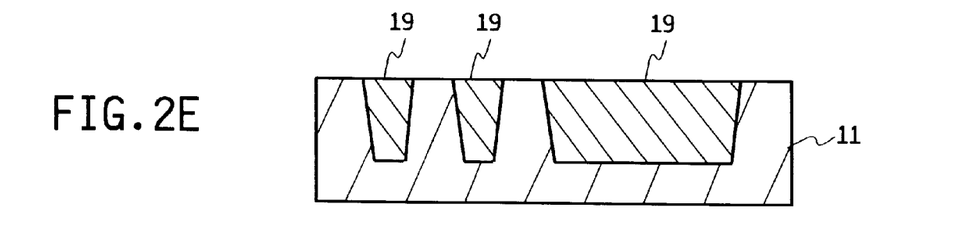

Thereafter, etching of the silicon substrate 11 is carried out, wherein the silicon nitride layer 15x subjected to the patterning serves as an etching mask. Then, as illustrated in FIG. 2B, a structure including a recess or recessed portion 11a having a depth $\underline{d}$ (a value of $\underline{d}$ will be mentioned later) is formed in an area where no silicon nitride layer 15x exists. Subsequently, the same structure is treated for several minutes through several tens minutes in dry $O_2$ at a pressure on the order of 25 atm and a. temperature in the range 900–1000° C., and, as schematically shown in FIG. 2C, the field oxide 19 is formed in an area where the recessed portion 11a of the silicon substrate 11 is formed.

Thereafter, the silicon nitride layer 15x is removed by thermal phosphoric acid, and the polishing process is effected on a resulting structure (FIG. 2D), thereby forming a structure (FIG. 2E) assuming a flat surface configuration in which the silicon nitride layer 15x is removed.

Thus, according to the present forming method, the oxidation starts the position (the surface of the recessed portion 11a) lower than the surface of the silicon substrate 11. Therefore, a portion of the field oxide 19 inside the silicon substrate 11, obtained by the above oxidizing process is, as schematically illustrated in FIG. 2C, larger a portion thereof that protrudes above the silicon substrate 11. More specifically, letting L be a depth necessary for forming the field oxide 19, then, according to the present forming method, the thermal treatment is executed so that the oxidation progresses by L–d in a depthwise direction. Further, a volume ratio of silicon to $SiO_2$ is approximately 1:2, and hence a field oxide layer 19 having a height of approximately L–d from the surface of the recessed portion 11a is formed by that thermal treatment. That is, if the field oxide 19 existing down to the position of the depth L from the substrate surface is formed by the above-described procedures, a height of the protruding portion of the field oxide 19 becomes approximately L–2d.

A portion that must be polished by the CMP method, etc. is the protruding portion having the height of L–2d, and therefore, according to the present forming method, a flat surface is obtained by less polishing than required in the above explained first embodiment.

Further, if the depth d and the oxidation conditions (particularly the duration of the oxidation process) are set so that the height ($\approx L-2d$) of the protruding portion formed by the oxidizing process is in the vicinity of "0", it follows that a structure with a slight ruggedness is obtained by the above-mentioned procedures. Therefore, as far as the conditions are thus set, it is possible to form the isolation region in such a form that the subsequent treatments are never influenced even by performing no polishing.

Third Embodiment

A method of forming the isolation region in a third embodiment is a modification of the isolation region forming method in the first embodiment. According to the isolation region forming method in the third embodiment, a mask for forming the isolation region is provided in procedures different from those in the first embodiment.

The isolation region forming method in the third embodiment will be hereinafter explained with reference to FIGS. 3A–3H.

Figure 3A:
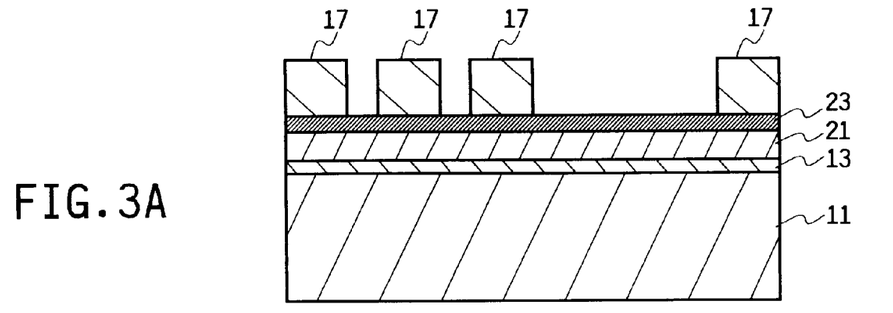
FIGS. 3A through 3H are sectional views of assistance in explaining the isolation region forming method in a third embodiment.

When the isolation region is formed based on the present forming method, at first, the pad oxide ($SiO_2$) layer 13 having a thickness of 5–30 nm is formed by thermal oxidation on the silicon substrate semiconductor substrate) 11 in order to obtain a structure shown in FIG. 3(A). Formed subsequently on the pad oxide layer 13 is a silicon nitride ($Si_3N_4$) layer 21 having a thickness of 50–300 nm by the CVD (Chemical Vapor Deposition) method, etc, and furthermore a polycrystalline silicon layer 23 having a thickness of 10–100 nm is formed. Thereafter, the photo resist is coated over the polycrystalline silicon layer 23, and, by using the photo lithography technique, the resist pattern 17 having an opening is formed in a portion corresponding to the area where the isolation region should be provided.

Figure 3B:
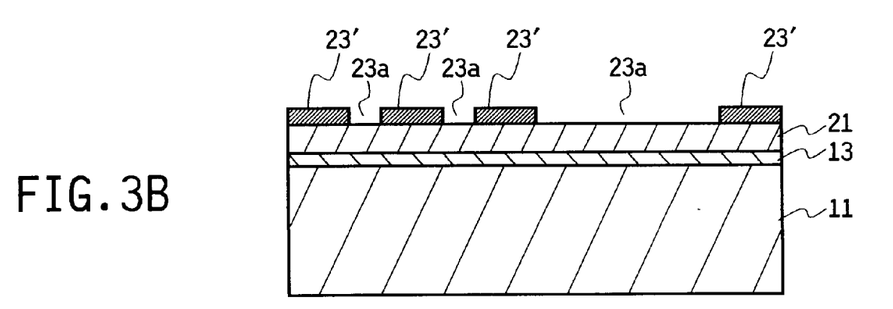

Next, with the resist pattern 17 serving as a mask, etching of the polycrystalline silicon layer 23 is effected on a structure (FIG. 3A) in such procedures. Then, after etching, the resist pattern 17 is removed, and, as illustrated in FIG. 3B, a polycrystalline silicon layer 231 formed with an opening 23a is formed on the silicon nitride layer 21.

Figure 3C:
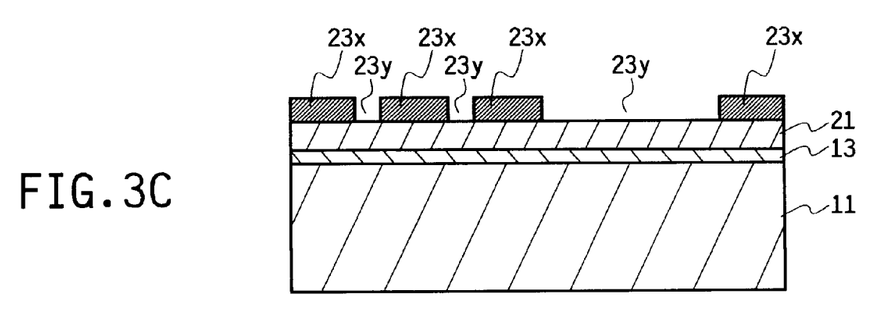

Subsequently, a thermal treatment on the order of 950° C. is effected on a structure shown in FIG. 3B takes place in a wet oxygen atmosphere for about 60 minutes to oxidize the poly crystalline silicon layer 23' that has been undergone patterning. As already explained, the silicon oxidation entails approximately a 2-fold increase in volume, and, with this oxidizing treatment, as illustrated in FIG. 3C, a silicon oxide layer 23x including an opening 23y having a width narrower than the opening 23a formed by using the photo lithography is formed on the silicon nitride layer 21.

Figure 3D:
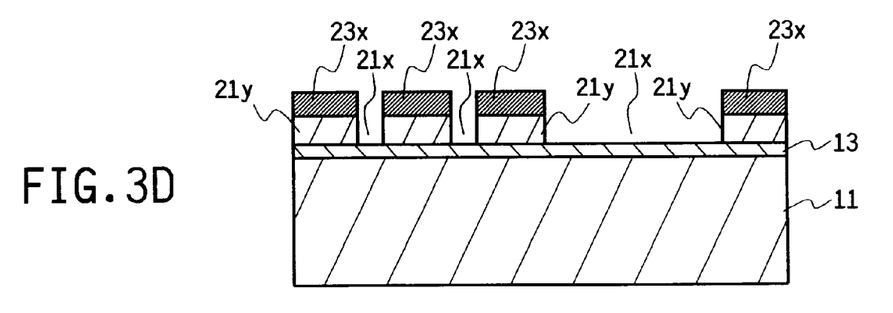

Subsequently, a part of the silicon nitride layer 21 is removed, wherein the thus formed silicon oxide layer 23x is sued as an etching mask. Then, as shown in FIG. 3D, a silicon nitride layer 21y subjected to patterning in the same shape as that of the silicon oxide layer 23x is formed on the pad oxide layer 13.

Figure 3E:
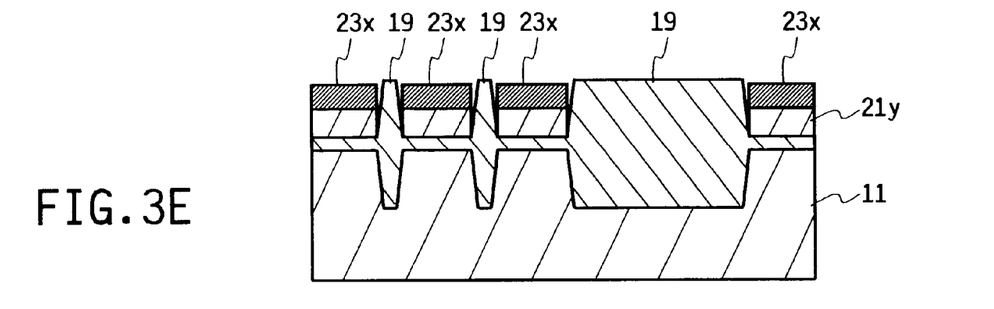
Figure 3F:
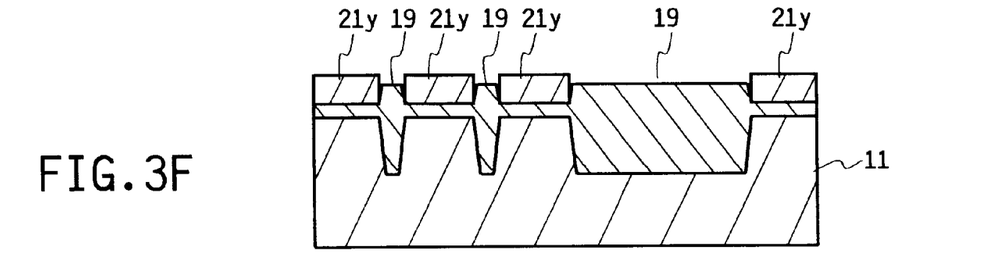
Figure 3G:
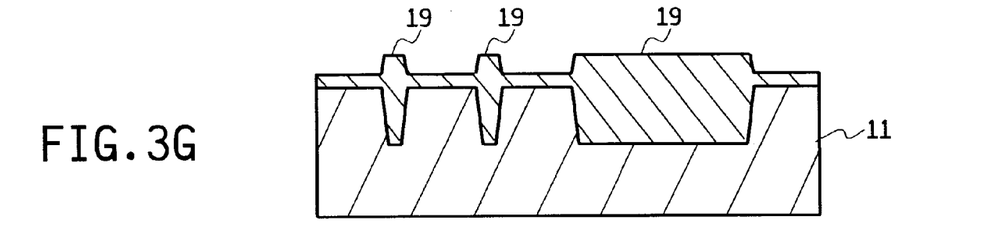
Figure 3H:
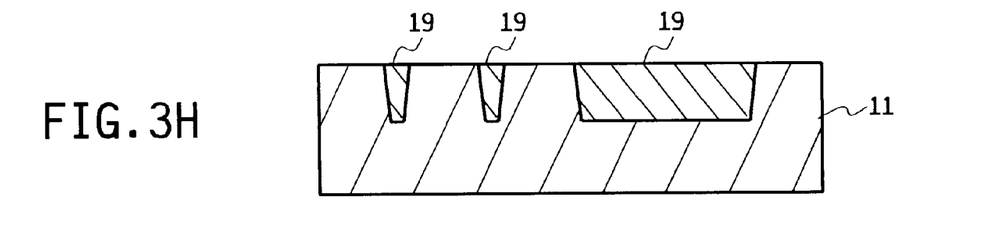

Thereafter, a structure (FIG. 3D) formed with the silicon nitride layer 21y is treated for several minutes through several tens minutes in dry $O_2$ on the order of 25 atm. at 900–1000° C., and, as shown in FIG. 3E, the field oxide 19 is formed in an area, wherein the silicon nitride layer 21y does not exist, on the silicon substrate 11. Next, the silicon oxide layer 21y (and a part of the field oxide 19) is removed by HF etching, etc., thereby forming a structure illustrated in FIG. 3F. Thereafter, the silicon nitride layer 21y is removed by thermal phosphoric acid. Then, the polishing treatment based on the CMP method or the like is effected on a structure (FIG. 3G) in which the mask 21y is removed, and, as illustrated in FIG. 3H, a structure assuming a flat surface configuration is formed.

Thus, according to the present forming method, a pattern (the silicon nitride layer 21y) with the opening the width of which is by far narrower than the patterns (the resist pattern 17, and the polycrystalline silicon layer 23') formed by using the photo lithography, is formed by making use of the increment in terms of volume due to the silicon oxidation. Then, the field oxide is formed with this pattern being used as a mask. If the present forming method is employed, it is therefore feasible to form the isolation region having a hyperfine isolation width without using even the one exhibiting a high resolution.

Note that the width of the isolation region to be formed is controlled by adjusting the thickness of the polysilicon layer 23', or by adjusting the oxidizing condition of the polycrystalline silicon layer 23' according to the present forming method. That is, when trying to form the isolation region with a still narrower isolation width, a thick polycrystalline silicon layer 23' is to be formed. Further, when trying to form the isolation region with a width slightly narrower than the width of the opening, the oxidizing condition is set so that only a part of the polycrystalline silicon layer 23' is oxidized. As a matter of course, the width of the isolation region to be formed may be controlled by adjusting both of the layer thickness and the oxidizing condition.

Fourth Embodiment

According to the method of forming the isolation region in accordance with a fourth embodiment, as in the same way with the isolation region forming method in the third embodiment, the isolation region is formed by using not the mask formed by the photo lithography but a mask formed based on the former mask.

The isolation region forming method in the fourth embodiment will be hereinafter discussed with reference to FIGS. 4A–4I.

Figure 4A:
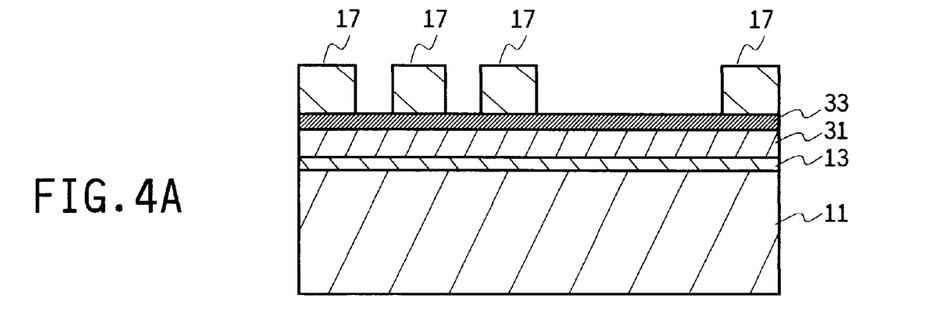
FIGS. 4A through 4I are sectional views of assistance in explaining the isolation region forming method in a fourth embodiment.

When the isolation region is formed based on this forming method, in the same procedures as those explained in the third embodiment, the pad oxide layer 13, a silicon nitride layer 31 and a polycrystalline silicon layer 33 are formed on the silicon substrate 11, and further the resist pattern 17 with no existence of the resist is formed in the area corresponding to the isolation region (FIG. 4A).

Figure 4B:
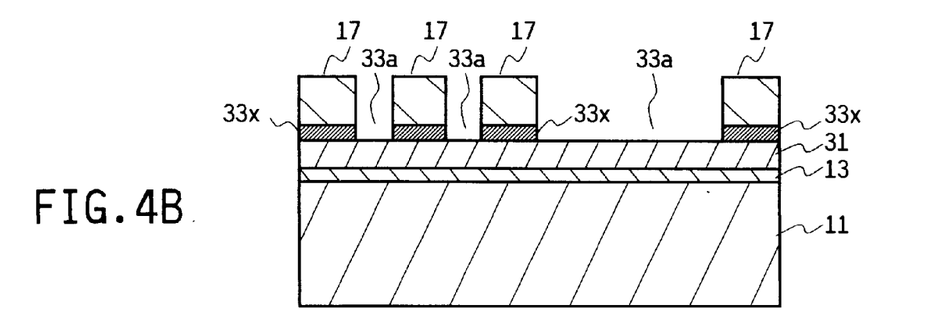
Figure 4C:
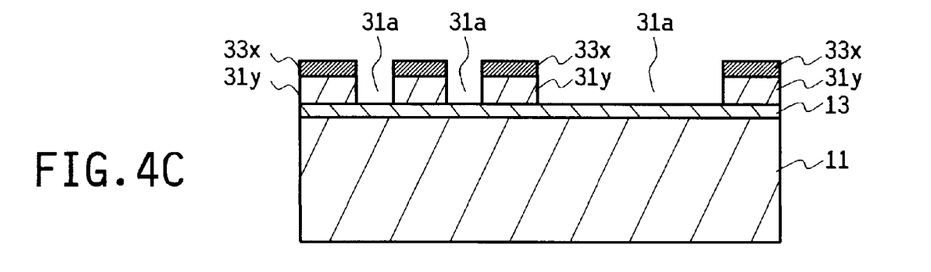

Subsequently, with the resist pattern 17 serving as a mask, the polycrystalline silicon layer 23 is etched, ad, as shown in FIG. 4B, a polycrystalline silicon layer 33x including an opening 33a is formed on the silicon nitride layer 31. Thereafter, furthermore, the silicon nitride layer 31 is etched with the resist pattern 17 being used as the mask, and the resist pattern 17 is then removed. As illustrated in FIG. 4C, a silicon nitride layer 33y including an opening 31a is formed on the pad oxide layer 13.

Figure 4D:
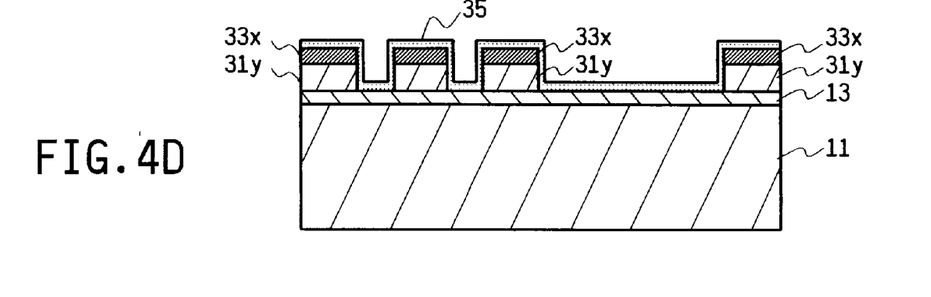
Figure 4E:
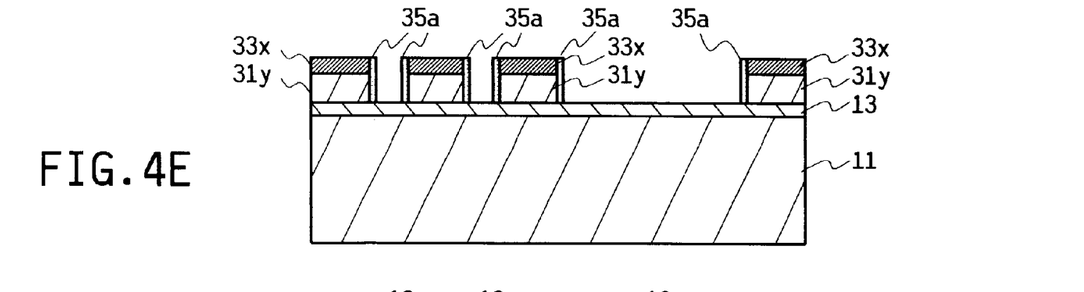

Next, a silicon nitride layer 35 having a substantially uniform thickness is formed internally (on wall surfaces and a bottom surface) of the opening 31a and on the polycrystalline silicon layer 33 as well by, as shown in FIG. 4D, depositing $Si_3N_4$ which involves the use of the CVD method. Then, the silicon nitride layers 35 existing on the bottom surface of the opening 31a and on the surface of the polycrystalline silicon 33, are removed by executing anisotropic etching. Formed subsequently, as shown in FIG. 4E, is such a structure that the silicon nitride layer 35 (hereinafter referred to as a side wall 35a) is residual only the wall surfaces of the opening 31a.

Figure 4F:
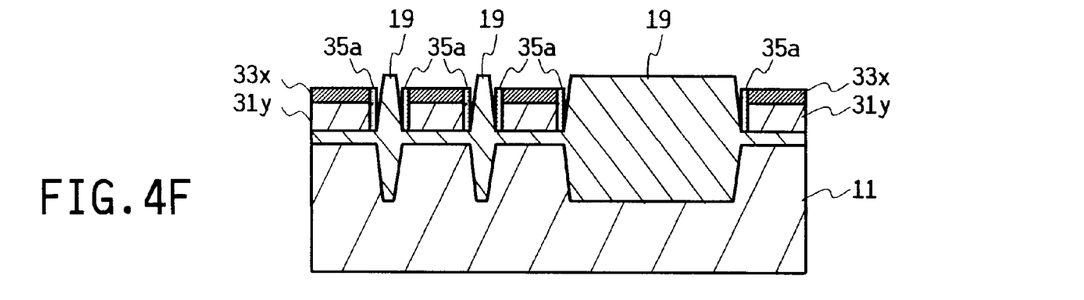
Figure 4G:
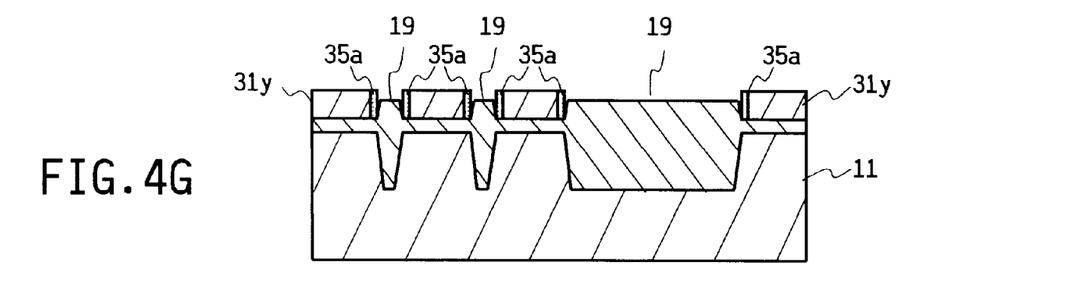
Figure 4H:
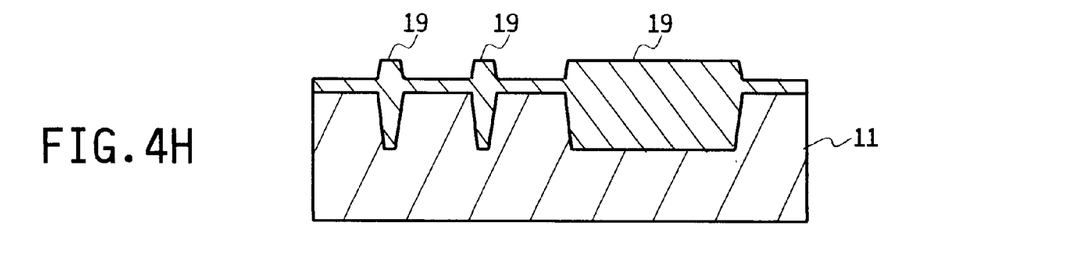
Figure 4I:
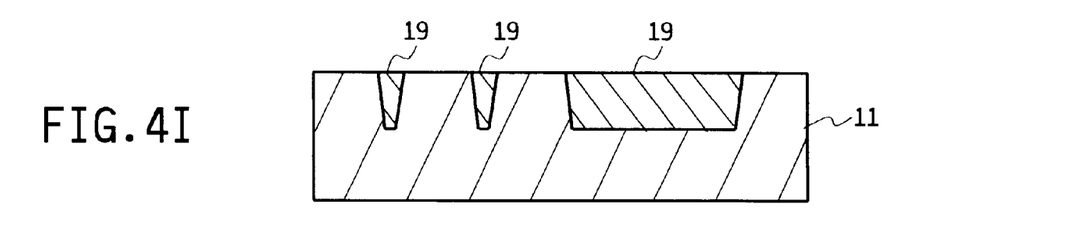

Thereafter, a high-pressure oxidation is carried out, and, as shown in FIG. 4F, the field oxide 19 is formed within the opening with a narrowed width due to the side walls 35a. Subsequently, the silicon oxide layer 21y (and a part of the field oxide 19) is removed by the HF etching, thereby forming a structure shown in FIG. 4G. Furthermore, the silicon nitride layer 31y and the side walls 35a are removed by the thermal phosphoric acid. Then, the polishing treatment based on the CMP method is effected on a thus obtained structure (FIG. 4H), and, as illustrated in FIG. 4I, a structure taking the flat surface configuration is formed.

Thus, according to this forming method, there is formed the mask pattern (the silicon nitride layer 33x plus the side walls 35a) including the opening the width of which is narrower than the mask pattern (the resist pattern, and the silicon nitride layer 33x) formed by the photo lithography, and the isolation region is formed by use of this mask pattern. Therefore, it follows that the isolation region having the hyperfine pattern width can be, if the present forming method is employed, formed by using no such photo lithography as to exhibit a high resolution. Further, the opening is narrowed by depositing an oxidationproof material, and hence, according to this method, the width of the isolation region (the width of the opening) can be controlled in a wider range than by the method explained in the third embodiment.

Although the four embodiments have been discussed so far, the present invention is not confined to these embodiments.

For example, in each of the embodiments, the isolation region is formed on the silicon substrate. However, the forming method explained in each of the embodiments is applicable to any kinds of substrates on the condition that the substrate is composed of the semiconductor transformed into an insulating body due to the oxidation. Further, in accordance with each of the embodiments, the pad oxide layer and the silicon nitride layer are formed on the silicon substrate. Instead of the silicon nitride layer, however, a layer composed of other oxidationproof material may also be used. Moreover, the pad oxide layer is a layer provided for relieving the influence by a difference in terms of a thermal expansion coefficient between the silicon nitride layer and the silicon substrate. Hence, in such a case that the thermal expansion coefficient of the substrate material is substantially the same as the thermal expansion coefficient of the oxidationproof material of which the mask is composed, as a matter of course, the isolation region can be formed without providing a layer corresponding to the pad oxide layer.

Further, after the step of forming the silicon nitride layer 21y in the third embodiment, there may be added a step of forming a recessed portion in a portion, corresponding to the opening 21x, of the silicon substrate 11. As described above, if the step of forming the recessed portion is added, as explained in the second embodiment, a size of the protruded portion of the field oxide residual after removing the silicon nitride layer 21y can be made still smaller. A part of the field oxide 19 is, however, removed when removing the silicon oxide layer 23x, and hence, if the step of forming the recessed portion is added, it is required that a depth of the recessed portion to be formed be determined in consideration of a removed quantity.

Similarly, the step of forming the recessed portion may be adopted for the forming method explained in the fourth embodiment.

Furthermore, it is possible to form masks for the other purposes (e.g. for wire formation) with using mask forming processes disclosed in the third and fourth embodiments.

It is apparent that, in this invention, a wide range of different working modes can be formed based on the invention without deviating from the spirit and scope of the invention. This invention is not restricted by its specific working modes except being limited by the appended claims.

What is claimed is:

1. A method of forming an isolation region, comprising:

forming a first layer of an oxidation-proof material on the semiconductor substrate;

forming a second layer on the first layer, wherein the second layer has an opening in an area corresponding to an area of the substrate where the isolation region should be formed, and is composed of a material whose volume increases when oxidized;

oxidizing the second layer within the opening;

after the oxidizing, etching the first layer with the oxidized second layer used as an etching mask, to pattern the first layer;

forming an oxide on a portion of the substrate corresponding to the opening of the oxidized second layer, by thermally treating the substrate in an oxidative atmosphere of such a pressure that oxidation in a thicknesswise direction of the substrate progresses faster than oxidation in a direction orthogonal to the thicknesswise direction; and polishing the substrate so as to remove a protruding portion of the oxide formed in said oxide forming.

2. A method of forming an isolation region, comprising:

forming a first layer of an oxidation-proof material on the substrate;

forming a second layer on the first layer, wherein the second layer has an opening in an area corresponding to an area of the substrate where the isolation region should be formed, and is composed of a material whose volume increases when oxidized;

oxidizing the second layer within the opening:

after the oxidizing etching the first layer with said oxidized second layer used as an etching mask, to pattern the first layer;

processing the substrate so as to form a recess in an area of the substrate corresponding to the opening of the oxidized second layer; and after said processing the substrate, forming an oxide on a portion of the substrate corresponding to the opening of the oxidized second layer, by thermally treating the substrate in an oxidative atmosphere of such a pressure that oxidation in a thicknesswise direction of the substrate progresses faster than oxidation in a direction orthogonal to the thicknesswise direction.

3. A method of forming an isolation region according to claim 2, further comprising:

polishing the substrate so as to remove a protruding portion of the oxide formed in said oxide forming step.

4. A method of forming an isolation region according to claim 2, wherein the substrate is a silicon substrate, the first layer is composed of silicon nitride, and the second layer is composed of silicon.

5. A method of forming an isolation region according to claim 1, wherein the substrate is a silicon substrate, the first layer is composed of silicon nitride, and the second layer is composed of silicon.

* * * * *